United States Patent
Lee (10) Patent No.: US 8,123,903 B2
(45) Date of Patent: Feb. 28, 2012

(54) PLASMA REACTOR HAVING MULTIPLE ANTENNA STRUCTURE

(75) Inventor: Weon-Mook Lee, Yongin-si (KR)

(73) Assignee: DMS Co., Ltd., Suwon (KR)

( * ) Notice: Subject to any disclaimer, the term of this patent is extended or adjusted under 35 U.S.C. 154(b) by 1085 days.

(21) Appl. No.: 11/995,214

(22) PCT Filed: Jul. 6, 2006

(86) PCT No.: PCT/KR2006/002643
§ 371 (c)(1),
(2), (4) Date: Jan. 10, 2008

(87) PCT Pub. No.: WO2007/011121
PCT Pub. Date: Jan. 25, 2007

(65) Prior Publication Data
US 2008/0210378 A1    Sep. 4, 2008

(30) Foreign Application Priority Data
Jul. 19, 2005   (KR) .................. 10-2005-0065381

(51) Int. Cl.
*C23C 16/00* (2006.01)
*H01L 21/306* (2006.01)
(52) U.S. Cl. ........... 156/345.48; 118/723 I; 118/723 AN
(58) Field of Classification Search ............... 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 4,948,458 A | 8/1990 | Ogle | |
| 5,476,182 A * | 12/1995 | Ishizuka et al. | 216/68 |
| 6,077,384 A * | 6/2000 | Collins et al. | 156/345.29 |
| 6,352,049 B1 * | 3/2002 | Yin et al. | 118/723 MP |
| 6,475,335 B1 | 11/2002 | Yin et al. | |
| 6,685,798 B1 * | 2/2004 | Holland et al. | 156/345.48 |
| 2006/0113182 A1 * | 6/2006 | Park et al. | 204/192.12 |

FOREIGN PATENT DOCUMENTS

| | | |
|---|---|---|
| EP | 0 774 886 A1 | 5/1997 |
| JP | 06-089879 | 3/1994 |
| JP | 08-088190 | 4/1996 |
| JP | 2000-235972 | 8/2000 |
| KR | 1020020064806 | 8/2002 |
| KR | 1020050066015 | 6/2005 |

* cited by examiner

*Primary Examiner* — Luz L. Alejandro
(74) *Attorney, Agent, or Firm* — Gifford, Krass, Sprinkle, Anderson & Citkowski, P.C.

(57) ABSTRACT

A plasma reactor includes a chamber in which a wafer is treated by a plasma reaction, the chamber being provided at an upper portion with a cylindrical dielectric window, a multiple antenna structure disposed on upper and lower portions of the dielectric window to generate RF magnetic field and apply the RF magnetic field inside the chamber through the dielectric window, thereby generating RF electric field, and an RF electric power supply unit for allowing for a time variation of the magnetic field of the multiple antenna structure.

14 Claims, 10 Drawing Sheets

PLASMA REACTOR HAVING MULTIPLE ANTENNA STRUCTURE

CROSS REFERENCE TO RELATED APPLICATIONS

This application is the U.S. national phase of PCT/KR2006/002643 filed Jul. 6, 2006, which claims priority of Korean Patent Application 10-2005-0065381 filed Jul. 19, 2005.

TECHNICAL FIELD

The present invention relates to a plasma reactor, and more particularly, to a plasma reactor having a cylindrical; dielectric window and a multiple antenna structure that can increase density and uniformity of plasma ion, and control ion energy properly, thereby device.

BACKGROUND ART

Generally, plasma is a fourth state of materials, which is neither solid, nor liquid, nor gas. The plasma is formed of partially ionized gas. The plasma is electrically neutral, but has electric conductivity by positively, or negatively ionized particles. Also, the plasma has sensitivity to electromagnetic field. The plasma may be controlled artificially by controlling the electromagnetic field applied to the plasma. Therefore, the plasma may be used in manufacturing a semiconductor element, a flat panel display, or other intergrated circuits.

That is, during a process of thin lay deposition or pattern etching, a high frequency electric power such as radio frequency (RF) is applied to both electrodes of a chamber. Then, reaction gas is supplied into the chamber in order to generate a glow discharge, thereby etching a substrate or depositing a thin layer on a surface of a wafer.

Recently, a variety of plasma reactors that can perform a substrate treatment using the plasma have been developed.

According to a shape of an antenna and a dielectric window, the plasma reactors are classified into a solenoid type, a planar type, or a dome type.

A conventional solenoid type plasma reactor generates a plasma reaction by disposing a solenoid coil around the dielectric window.

However, since the conventional solenoid type plasma reactor has a relatively high inductance, a sputtering problem due to high voltage occurs and the heat generation efficiency is lowered.

The planar type plasma reactor is disclosed in U.S. Pat. No. 4,948,458 to Lam antenna disposed above the dielectric window.

However, the planar type plasma reactor has a short distance between a plasma source and the wafer, thereby making it difficult to have independent control of ion energy reaching the surface of the wafer.

The dome type plasma reactor is disclosed in U.S. Pat. No. 6,475,335 to Applied Materials.

The dome type plasma reactor has a dome shape dielectric window protruding upward. The antenna is disposed around the dome, and a gas is supplied from the side of the dome.

However, the dome type plasma reactor has a difficulty in providing a uniform etching rate in the case where the substrate is large-sized substrate.

DISCLOSURE OF INVENTION

Technical Problem

The present invention has been made in an effort to solve the above-described problems. It is an object of an embodiment of the present invention to provide a plasma reactor including a cylindrical dielectric window and a multiple antenna structure to lower an antenna voltage, thereby easily controlling a density, uniformity and ion energy of the plasma ion

Technical Solution

To achieve the above-described objects, the present invention provides a plasma reactor including: a chamber in which a wafer is treated by a plasma reaction, the chamber being provided at an upper portion with a cylindrical dielectric window; a multiple antenna structure disposed on upper and lower portions of the dielectric window to generate RF magnetic field and apply the RF magnetic field inside the chamber through the dielectric window, thereby generating RF electric field; and an RF electric power supply unit for allowing for a time variation of the magnetic field of the multiple antenna structure.

Advantageous Effects

The plasma reactor, according to the embodiment of the present invention, has several advantages, and they will be described now.

First, since the dielectric window of the chamber is cylindrical, the plasma reactor may have a space between the plasma source disposed above the window and the wafer disposed on the lower. Therefore, the plasma reactor may have high ion density, and independent control of the ion energy reaching the surface of the wafer.

Second, since the multiple antenna structure has a low inductance value, the plasma reactor may have the low antenna voltage, thereby minimizing cylindrical dielectric window damage, and contamination caused by sputtering.

Third, electric current flows along the multiple antenna structure in the same direction, and the multiple antenna structure has a same gap between the antennas. Therefore, intensity of uniform electric field generated inside the chamber may increases, thereby increasing the work efficiency, and having a uniform ion density of the plasma.

Fourth, an injector is disposed on the center of upper surface of the dielectric window in order to provide the reaction gas. Therefore, the reaction gas may be provided into the chamber efficiently, thereby having plasma ion diffusion, and reducing retention time of byproducts generated by etching at the center of the wafer.

Fifth, since the internal coils are formed in a variety of types such as a top-bottom separation type, an integral type, or a spiral type. Therefore, the plasma reactor may respond to various operating conditions.

The invention may, however, be embodied in many different forms and should not be construed as being limited to the embodiments set forth herein; rather these embodiments are provided so that this disclosure will be thorough and complete, and will fully convey the concept of the invention to those skilled in the art.

BEST MODE FOR CARRYING OUT THE INVENTION

A plasma reactor of the present invention will now be described more fully with reference to the accompanying drawings, in which exemplary embodiments of the invention are shown.

Figure 1:
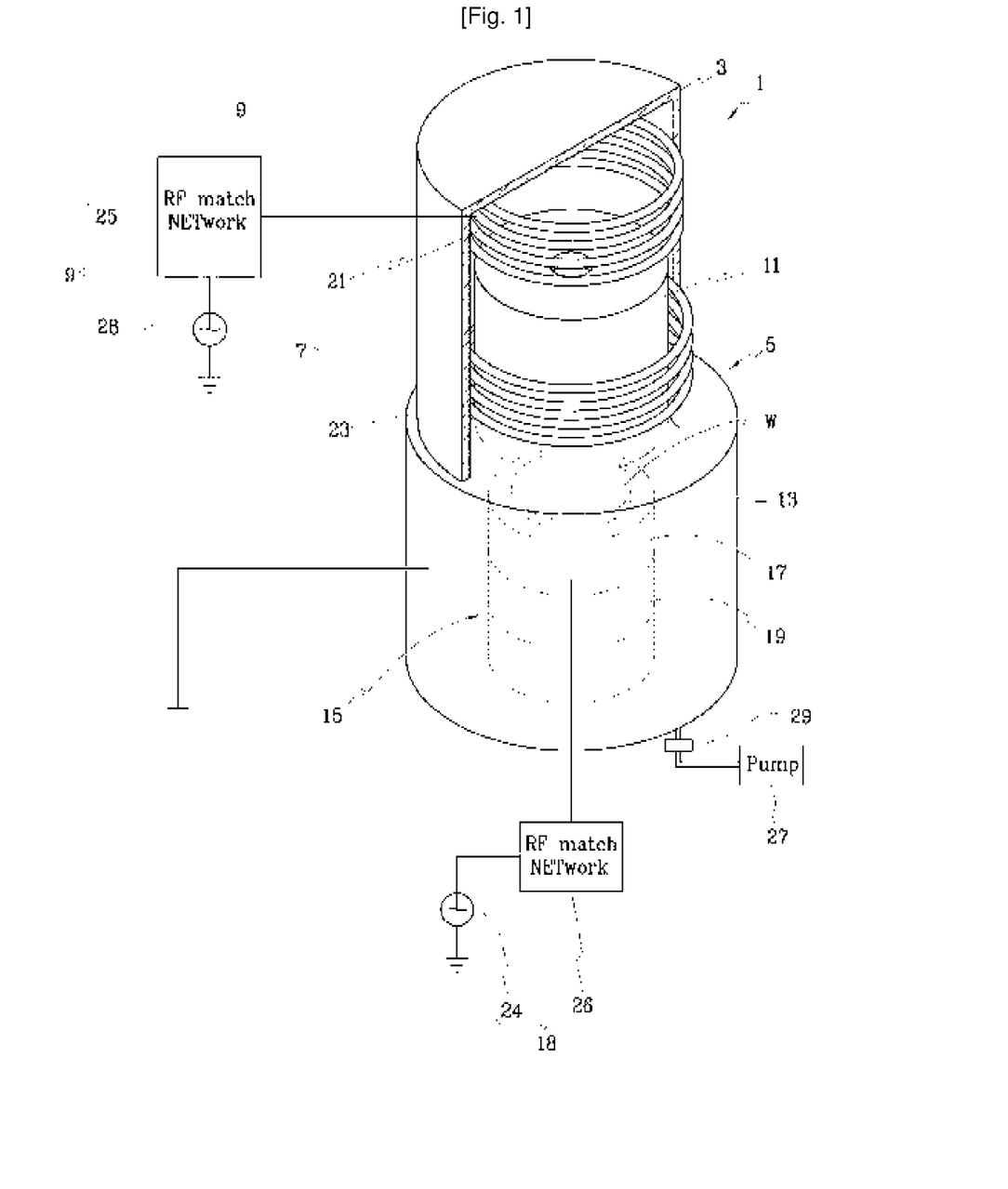
FIG. 1 is a perspective view of a plasma reactor having a multiple antenna structure according to an embodiment of the present invention.
Figure 2:
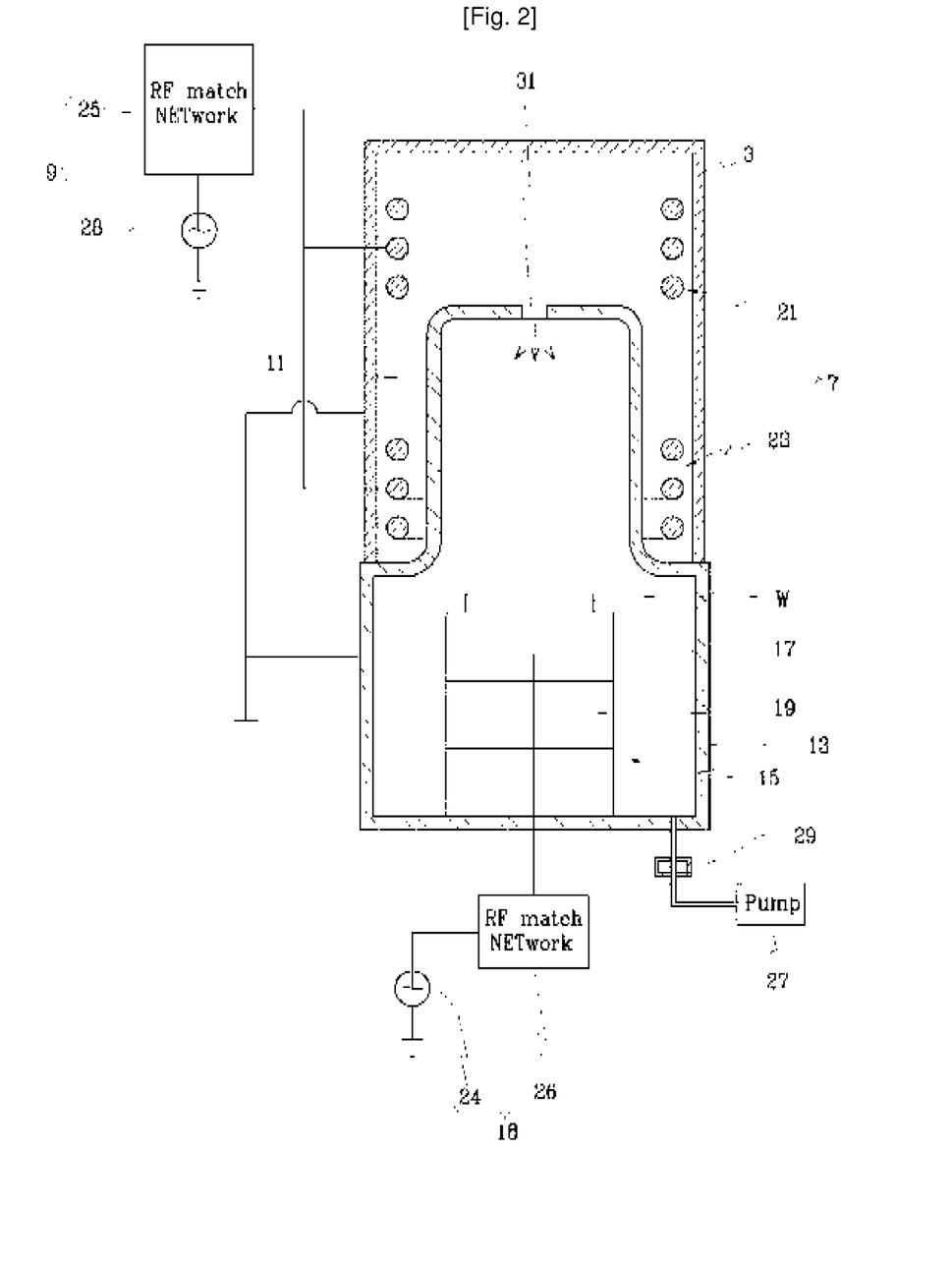
FIG. 2 is a side sectional view of an internal structure of the plasma reactor shown in FIG. 1.

FIG. 1 is a perspective view of a plasma reactor according to an embodiment of the present invention and FIG. 2 is a side sectional view of an internal structure of the plasma reactor shown in FIG. 1.

Referring FIGS. 1 and 2, a plasma reactor 1 according to an embodiment of the present invention includes a case 3, a chamber 5 whose upper portion is formed of a dielectric window 11, a multiple antenna structure 7 disposed outside of the dielectric window 11 for generating the RF magnetic field and applying the RF magnetic field inside the chamber 5 through the dielectric window 11, an RF electric power supply unit 9 applying the RF electric power to the multiple antenna structure 7 for allowing for the time variation of the magnetic field generated by the multiple antenna group 7.

In the above-described plasma reactor 1, a plasma reaction occurs in the chamber 5 and the chamber 5 maintains an electrically grounded status.

Also, the inside of the chamber 5 maintains vacuum status and the chamber 5 applies the electric power through the multiple antenna structure 7 and a lower electrode 17. Then, the reaction gas is supplied inside the chamber 5, and the RF magnetic field is generated by the multiple antenna structure 7. Therefore, plasma reaction is induced in the chamber 5, thereby treating a substrate, or a semiconductor (hereinafter, referred to as wafer W).

The chamber 5 includes a chamber body 13 in which the wafer W is disposed, a dielectric window 11 cylindrically extending from an upper portion of the chamber body 13 for receiving the RF magnetic field generated from the multiple antenna structure 7, a gas injector 31 formed on the upper portion of the dielectric window 11 for injecting the reaction gas into the chamber 5.

The wafer W is disposed on the lower electrode 17 in the chamber body 13 and the lower electrode 17 is disposed on an insulator 19.

The lower electrode 17 is connected with a matching circuit 26 of the electric power supply unit 18 so that electric power is uniformly applied to the lower electrode 17 from the electric power supply unit 18.

Therefore, ICP plasma source generated by the multiple antenna structure 7 disposed in the chamber 5 may provide intensive uniform ion density to the upper portion of the chamber 5. The incident ion energy on the wafer W may be controlled by, for example, bias power applied to the lower electrode 17.

The dielectric window 11 extends cylindrically upward from the chamber body 13 to a predetermined height.

The dielectric window 11 is formed of a material having a fixed dielectric constant, thereby functioning as a passage, in which the RF magnetic field may be efficiently applied to the chamber 5 through the dielectric window 11.

Also, the dielectric window 11 is formed with a predetermined ratio of a radius to a height thereof to provide a predetermined gap between the plasma source generated from the upper portion of the chamber 5 and the wafer W disposed on the lower portion of the chamber.

Therefore, an ion current flux reaching the wafer W may be controlled uniformly, and the ion energy may be controlled independently.

In addition, a pressure controller 29 and a vacuum pump 27 are connected to the lower part of the chamber. Therefore, pressure of the inside of the chamber 5 may be controlled by properly setting the pressure controller 29.

The plasma may be generated in the chamber 5 by the RF magnetic field and reaction gas. At this point, the RF magnetic field is generated by the multiple antenna structure 7.

That is, the RF magnetic field is generated when the RF electric power is applied to the multiple antenna structure 7. The RF electric field is induced inside the chamber 5 by the RF magnetic field. Electrons in the chamber 5 are accelerated by the induced RF electric field. The accelerated electrons collide repeatedly with molecules of the reaction gas, thereby generating high-density plasma.

The multiple antenna structure 7 includes a first external coil 21 and a second external coil 23. The multiple antenna structure 7 is disposed outside the cylindrical dielectric window 11.

Figure 3:
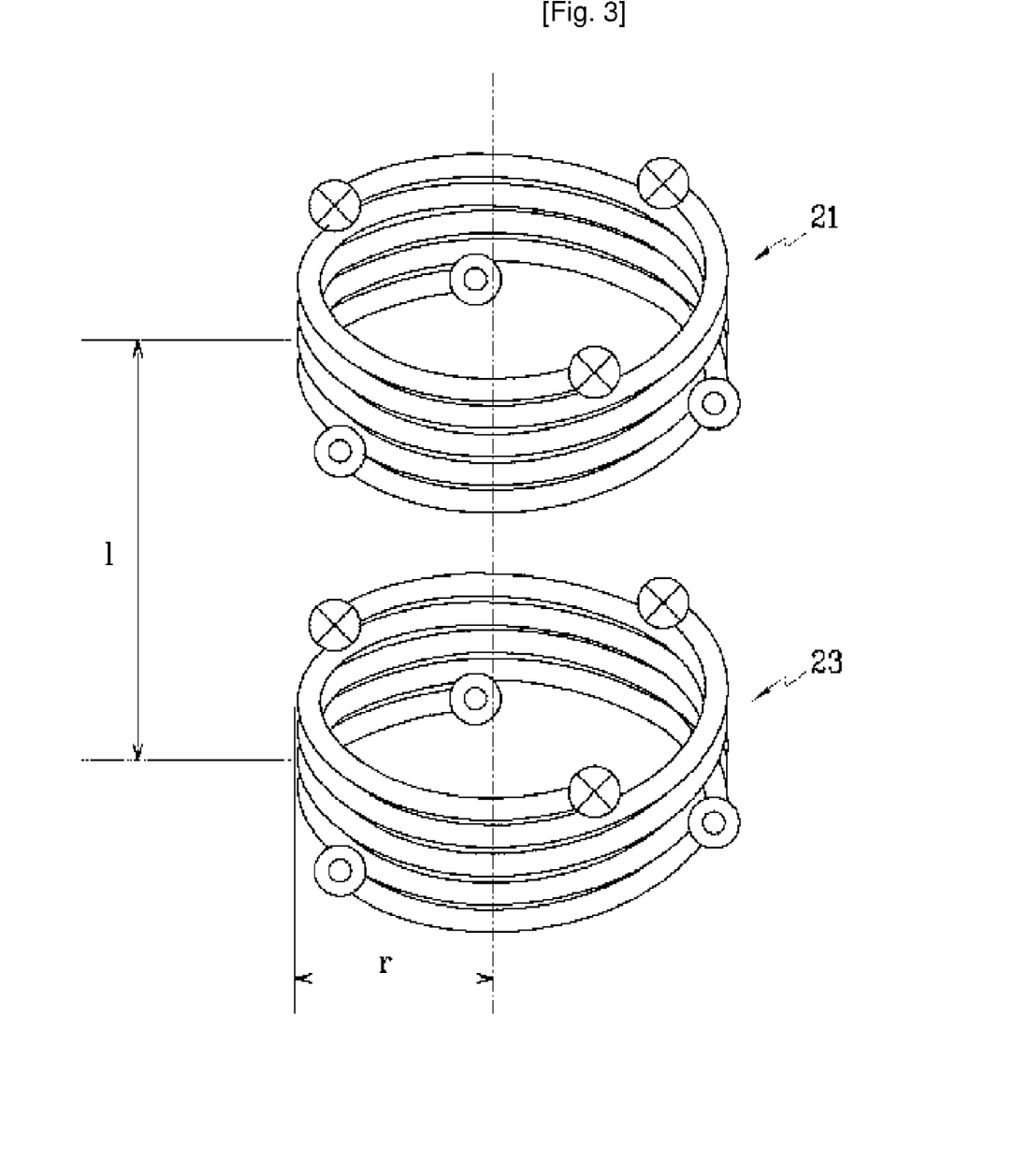
FIG. 3 is a perspective view of first and second external coils shown in FIG. 1.
Figure 4:
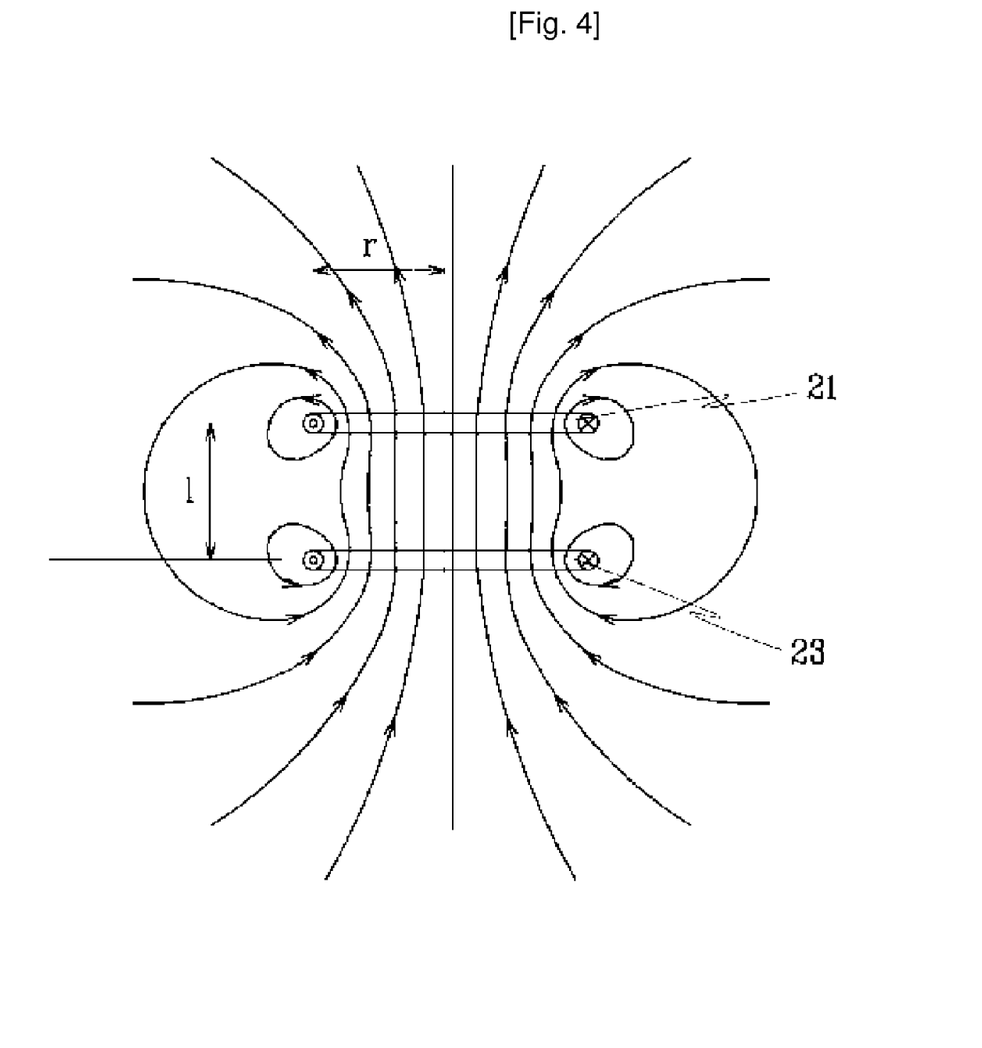
FIG. 4 is a view illustrating lines of magnetic force generated from the first and second external coils shown in FIG. 3.

The first and second external coils 21 and 23 are wound in an identical structure as shown in FIGS. 3 and 4, and each external coil is formed of a plurality of coils connected in parallel with each other.

The first and second external coils 21 and 23 have one or more coils (positive integer), preferably 3. The first and second external coils 21 and 23 have one or more turns (positive real number), preferably 1.5. The current flows along the first and second external coils 21 and 23 in an identical direction.

Also, the first and second external coils 21 and 23 are arranged to be spaced apart from each other by a predetermined distance in a vertical direction. That is, the second external coil 23 is disposed below the first external coil 21 with the predetermined distance equal to or shorter than a radius r of the first external coil 21.

Therefore, problems caused of conventional solenoid type coil, such as the sputtering problem by high voltage or the low efficiency problem, may be solved. That is, the uniform intensive RF magnetic field can be realized when the RF electric power source is applied to the first and second external coils 21 and 23.

Therefore, the more uniform intensive plasma ion density may be generated in the chamber 5.

Also, since the first and second external coils 21 and 23 are formed of the plurality of antenna coils connected in parallel with each other, the inductance value can be lowered. Therefore, the first and second external coils 21 and 23 have relatively low antenna voltage and high antenna current, thereby increasing antenna efficiency and reducing sputtering effect.

Reducing the sputtering effect may prevent the damage of the cylindrical dielectric window, which has been caused by sputtering. Furthermore, serious contamination caused by the damage of the cylindrical dielectric window can be prevented and service life of the dielectric window 11 can increase.

Also, the electric power source applied to the multiple antenna structure is provided by an electric power supply units 9 and 18 as shown in FIGS. 1 and 2.

That is, the electric power supply units 9 and 18 includes an RF electric power source supply unit 9 supplying the RF electric power to the multiple antenna structure 7, and a lower electric power supply unit 18 providing the electric power to the lower electrode 17.

Each of the RF and lower electric power supply unit 9 and 18 includes a high frequency electric power unit 24, 28 and a matching circuit 25, 26. The high frequency electric units 24 and 28 are respectively connected to the lower electrode 17 and the first and second external coils 21 and 23 through the Matching circuits 25 and 26.

Therefore, the RF magnetic field may be generated by applying RF electric power having a certain frequency from the electric power supply unit 9 to the multiple antenna structure 7.

At this point, several MHz to tens MHz, preferably 13.56 MHz RF electric power may be used as the RF electric power.

The gas injector 31 is disposed on the surface of cylindrical dielectric window 11, and the gas injector 31 is configured to inject the reaction gas downward.

The gas injector 31 is disposed on the center of the cylindrical dielectric window 11 to efficiently provide the reaction gas into the chamber. Therefore, plasma ion diffusion effect may be enhanced.

Also, the gas injector 31 injects the reaction gas in the center of the cylindrical dielectric window 11 to discharge the byproducts of the etching process at the center of the wafer W. Therefore, the retention time of the byproducts may be reduced.

At this point, the reaction gas provided by the gas injector 31 may desirably be $O_2$, $CF_4$, $CHF_3$, $BC_3$, $Cl_2$, or HBr.

Figure 5:
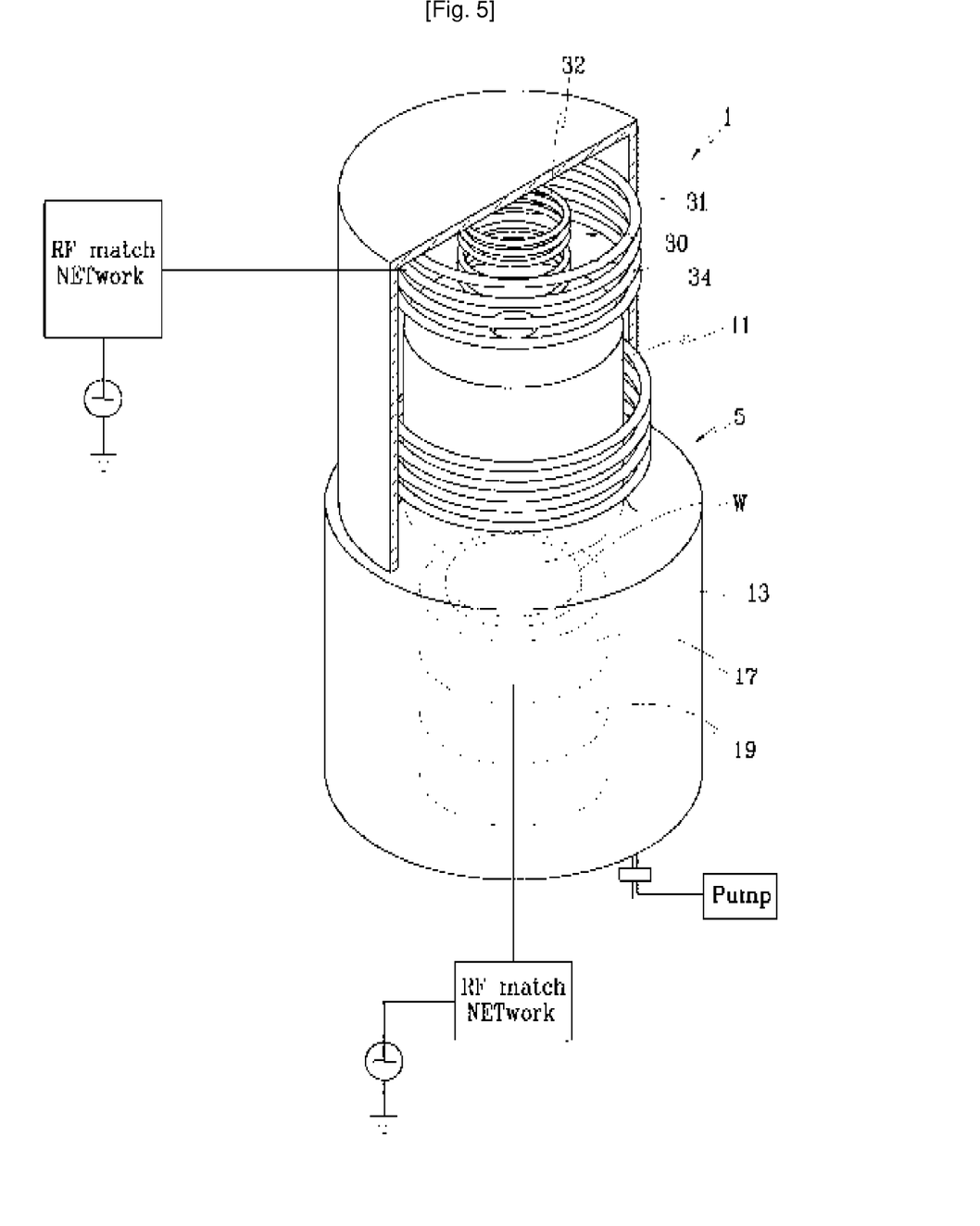
FIG. 5 is a perspective view of a plasma reactor according to another embodiment of the present invention.
Figure 6:
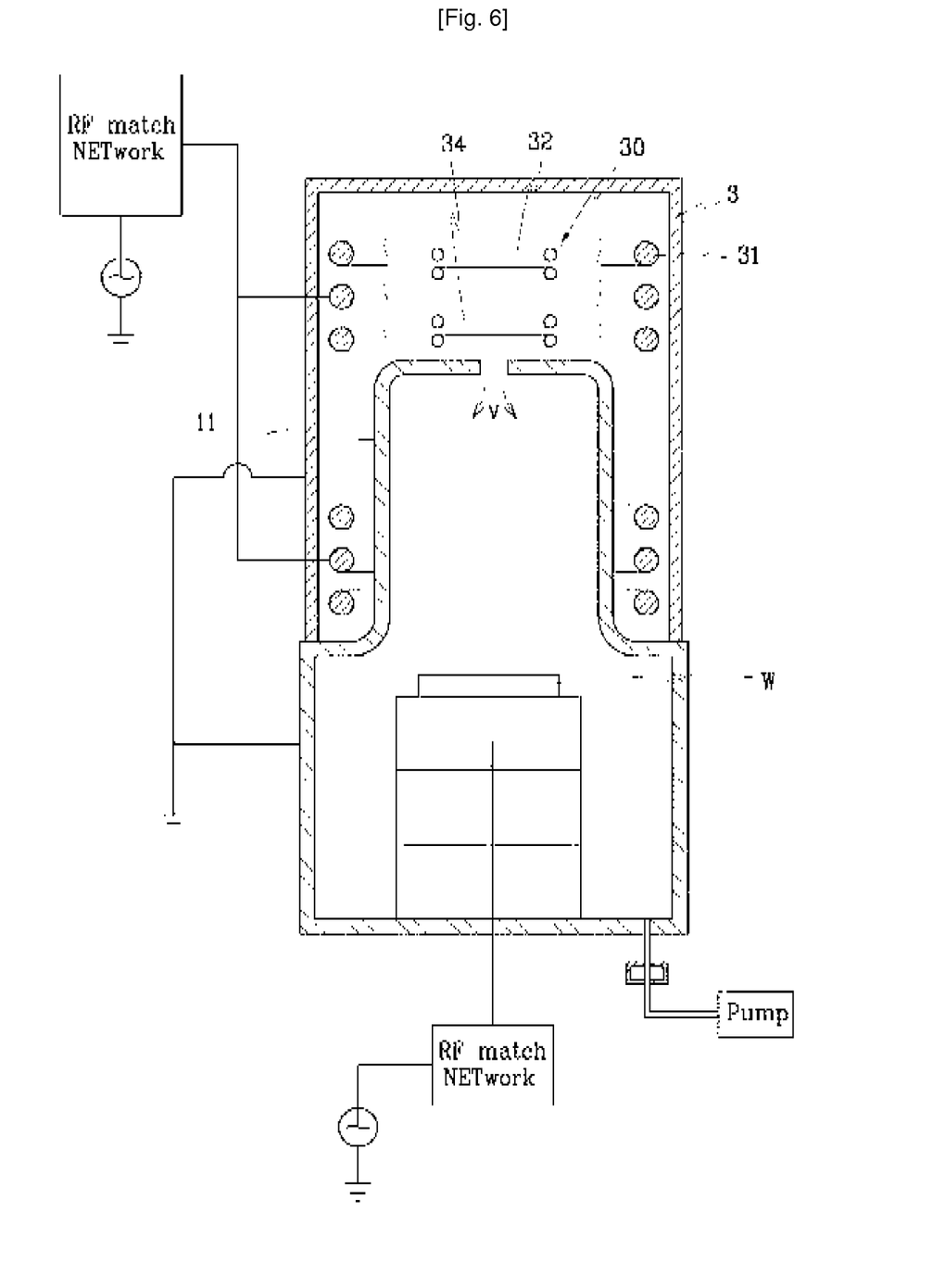
FIG. 6 is a side sectional view of the internal structure of the plasma reactor shown in FIG. 5.
Figure 7:
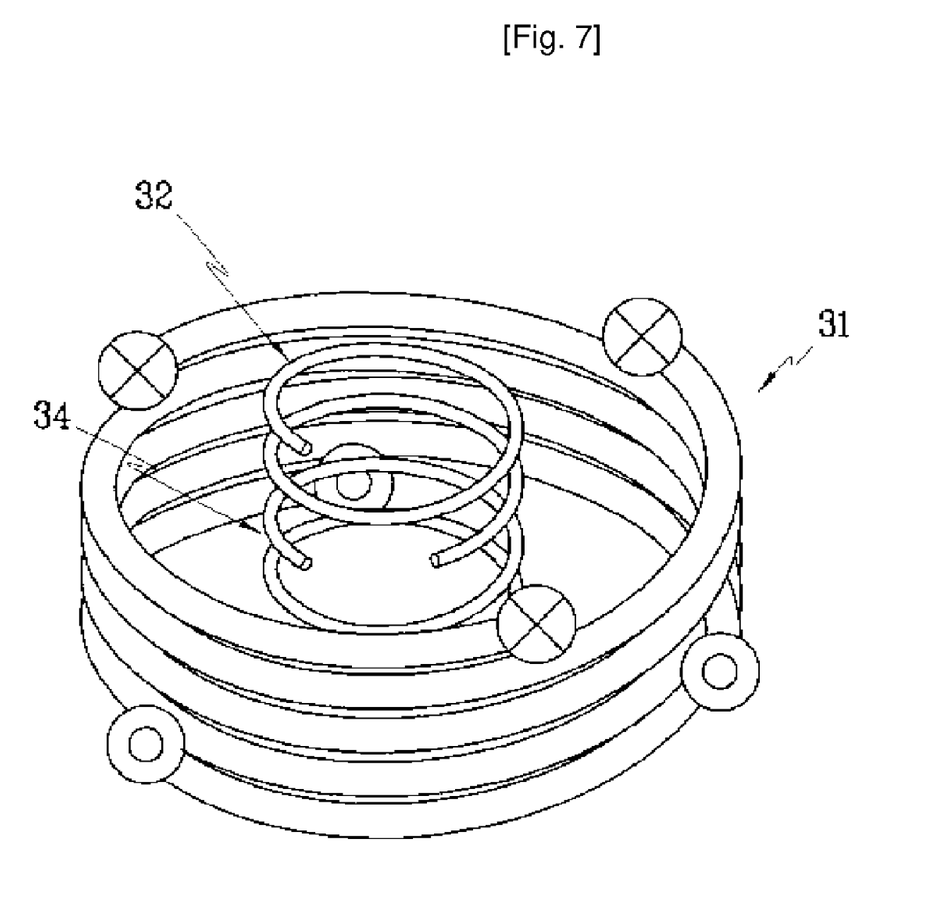
FIG. 7 is a partially enlarged perspective view of the internal coils shown in FIG. 5.

FIGS. 5 through 7 illustrate a multiple antenna structure according to another embodiment of the present invention. That is, additional internal coils 32 and 34 are disposed inside the first external coil 31. That is, the first and second internal coils 32 and 34 are disposed inside the first external coil 31.

By additionally disposing the internal coils 32 and 34 inside of the first external coil 31 disposed above the cylindrical dielectric window 11, the plasma reactor may have a large-sized process window.

At this point, the first and second internal coils 32 and 34 have the positive integer as the number of coil and the positive real as the number of turns (turn number, or winding number). The electric current flows along the first and second internal coils 32 and 34 in an identical direction.

The first and second internal coils 32 and 34 are disposed and spaced apart from each by a predetermined distance in a vertical direction. That is, the first internal coil 32 is disposed above the second internal coil 34 at a predetermined distance equal to or shorter than a radius r of the first internal coil 32.

Since the first and second internal coils 32 and 34 are additionally disposed, the ion density can be easily controlled at a center and edges according to a process used. Therefore, the plasma reactor may have a uniform etching rate a uniform critical dimension (CD) in a relatively large area.

Figure 8:
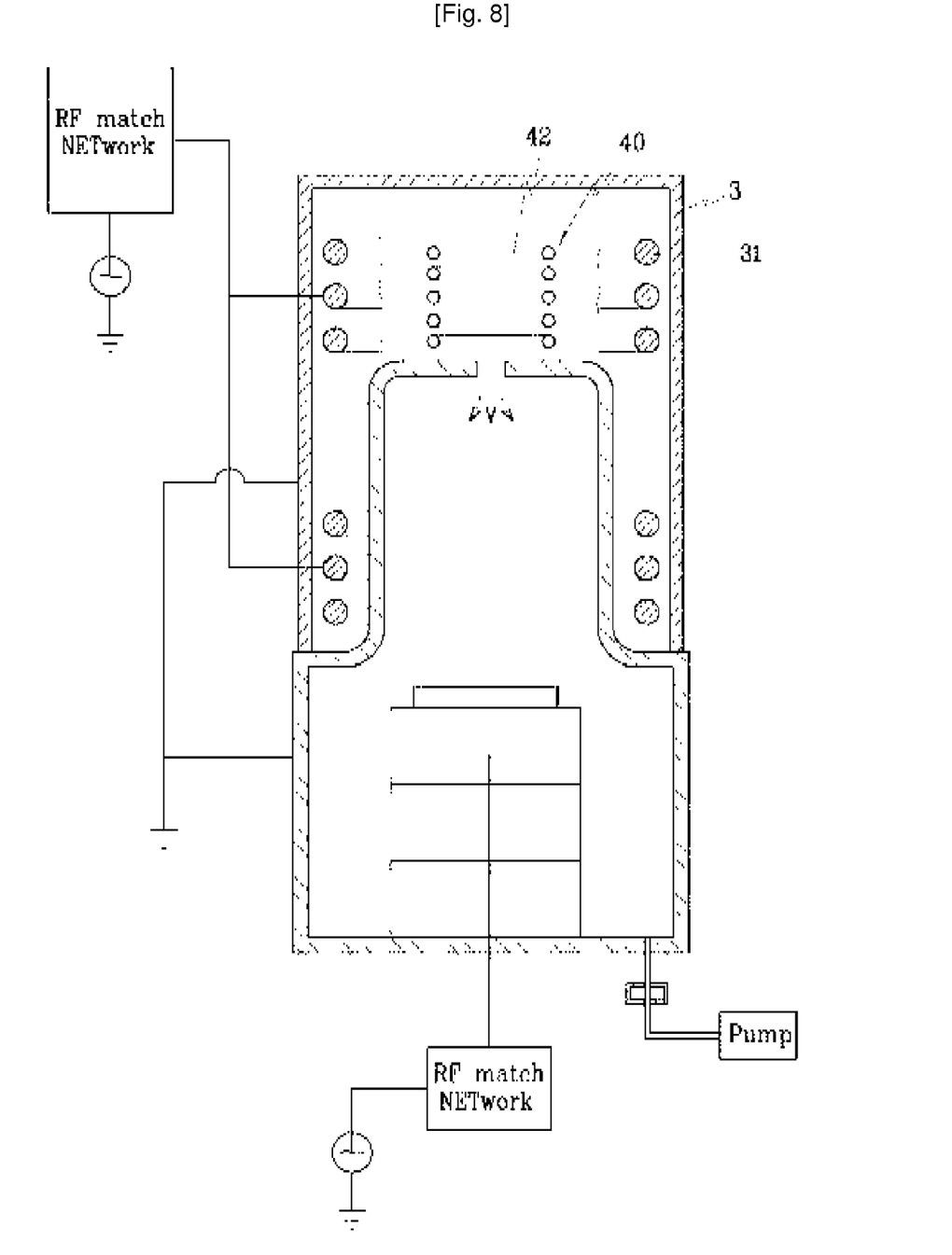
FIG. 8 is a side sectional view of a modified example of the internal coil shown in FIG. 5.

FIG. 8 shows a modified example of the internal coil. According to this modified example, a cylindrical single body internal coil is disposed instead of the paired internal coils.

That is, the cylindrical single body internal coil 42 may be disposed inside of the external coil 31 disposed in the case 3.

Figure 9:
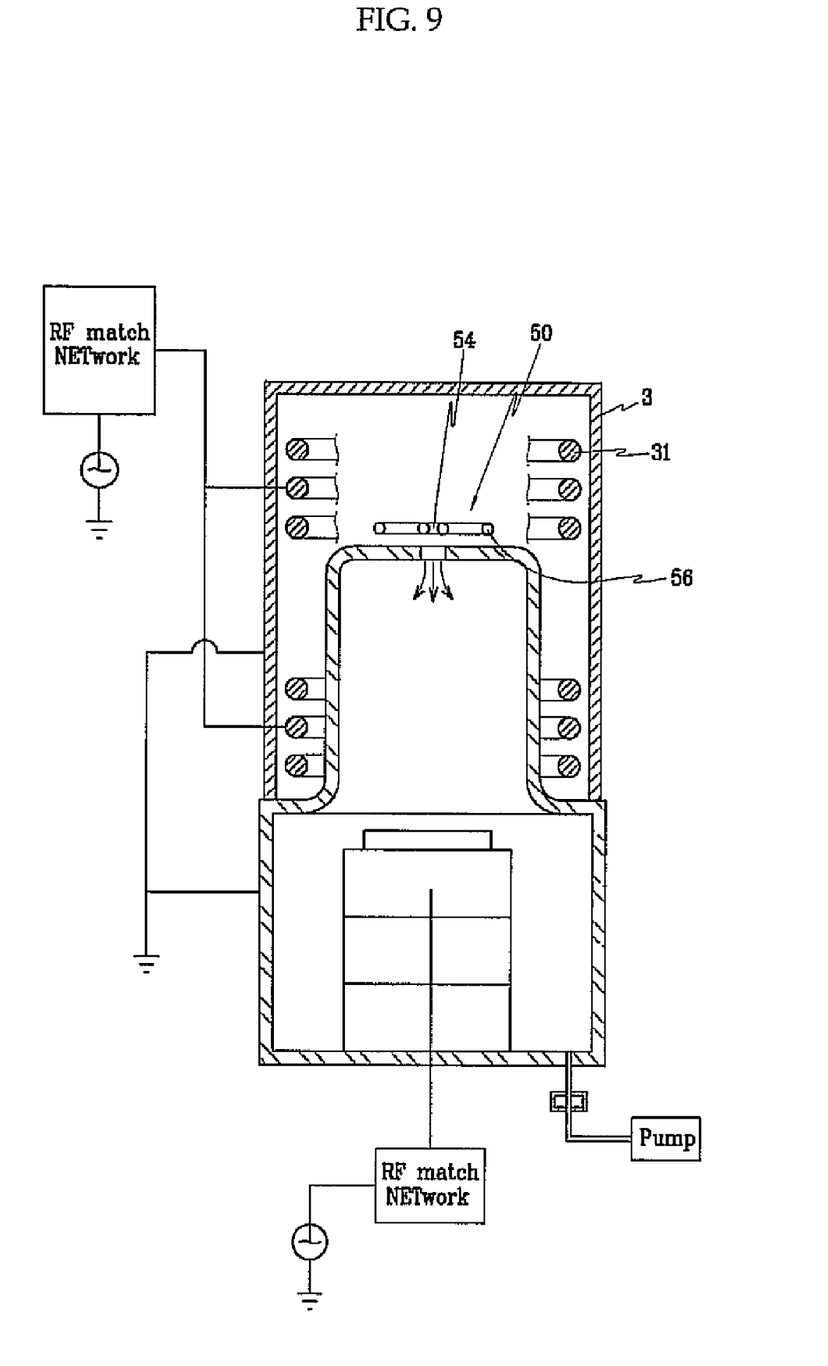
FIG. 9 is a side sectional view of another modified example of the internal coil shown in FIG. 5.
Figure 10:
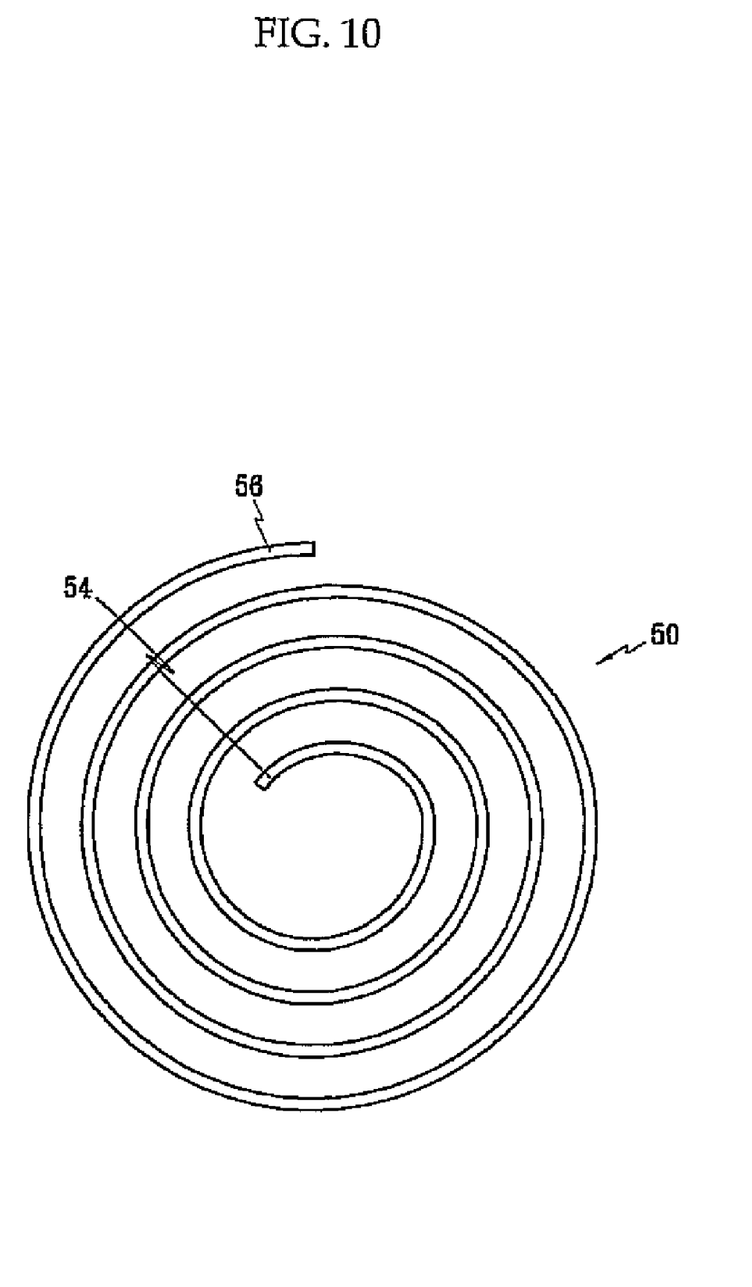
FIG. 10 is a top view of the internal coil shown in FIG. 9.

Referring to FIGS. 9 and 10 illustrating other modified examples of the internal coil, the internal coil may be a spiral coil. That is, the spiral coil 50 may be disposed inside of the external coil 31 disposed in the case 3.

At this point, the spiral coil 50 has planar spiral turns. That is, the spiral coil 50 is wound to have a plurality of turns wound from center to outside.

A shape of the internal coil is not limited to the above-described embodiments, that is, a shape of internal coil may be formed in a variety of shapes according to an operating condition.

The operation of the plasma reactor will now be described more fully with reference to the accompanying drawings.

Referring to FIGS. 1 through 7, in order to treat the wafer W using the plasma reactor of the present invention, the wafer W having a predetermined size is provided in the chamber 5.

The reaction gas for the plasma reaction is injected into the chamber 5 by the gas injector 31. The reaction gas is injected downward from the center of the upper surface of the cylindrical dielectric window 11, thereby being uniformly dispersed inside the chamber 5.

After injecting the reaction gas, inside pressure of the chamber 5 is controlled properly by driving the pressure controller 29 and the vacuum pump 27.

That is, after the wafer W is provided into the chamber 5 and the reaction gas is injected into the chamber 5 by the gas injector, the RF electric power is applied to the multiple antenna structure 7.

At this point, the RF magnetic field is generated around the multiple antenna structure 7 by applying RF electric power source. The RF magnetic field may be applied inside the chamber 5 through the cylindrical dielectric window 11.

At this point, each of the first and second external coils 21 and 23 have the plurality of coils connected in parallel with each other and the electric current flows along the first and second external coils 21 and 23 in the same direction. Also, the first and second external coils 21 and 23 are spaced apart from each other by a predetermined distance in a vertical direction. That is, the second external coil 23 is disposed below the first external coil 21 at a predetermined distance equal to or shorter than the radius r of the first external coil 21.

Therefore, when the RF electric power is applied to the first and second external coils 21 and 23, the uniform intensive RF magnetic field may be generated.

Therefore, the more uniform intensive plasma ion density may be generated inside the chamber 5.

Also, since the first and second external coils 21 and 23 are connected with the plurality of antenna coils in parallel, the inductance value can be lowered. That is, the plasma reactor has the relatively low antenna voltage and high antenna electric current and thus the antenna efficiency is improved and the sputtering effect is reduced.

That is, by reducing the sputtering effect, the plasma reactor may prevent the damage of cylindrical dielectric window, the serious contamination by the cylindrical dielectric window damage, and the shortening of the lifetime of the cylindrical dielectric window part.

The RF magnetic field is generated by applying the RF electric power to the multiple antenna structure 7. The RF electric field is induced inside the chamber 5 by the RF magnetic field. Electrons in the chamber 5 are accelerated by the induced RF electric field inside the chamber 5. Therefore, the accelerated electrons repeatedly collide with molecules of the reaction gas, thereby forming high-density plasma. The ion energy of the collision reaction on the wafer W may be controlled by controlling the bias power applied to the lower electrode 17.

INDUSTRIAL APPLICABILITY

The plasma reactor of the present invention may be used in improving the manufacturing efficiency and quality of semiconductor devices.

The invention claimed is:

1. A plasma reactor comprising:
   a chamber in which a wafer is treated by a plasma reaction, the chamber being provided at an upper portion with a cylindrical dielectric window;
   a multiple antenna structure which generates an RF magnetic field and applies the RF magnetic field inside the chamber through the dielectric window, thereby generating RF electric field, said multiple antenna structure having:
      a first external coil disposed above the cylindrical dielectric window; and
      a second external coil disposed outside and around the lower portion of the cylindrical dielectric window, the second external coil being disposed spaced apart from and vertically aligned with the first external coil at a predetermined distance in a vertical direction; and
   an RF electric power supply unit for allowing for a time variation of the magnetic field of the multiple antenna structure.

2. The plasma reactor of claim 1, the plasma reactor comprises:
   a chamber body receiving the wafer and maintaining a vacuum status;
   the cylindrical dielectric window protruding upward from the upper portion to receive the RF magnetic field generated by the multiple antenna structure;
   a gas injector formed on the cylindrical dielectric window, the gas injector supplying the reaction gas inside the chamber; and
   a lower electrode supporting the wafer.

3. The plasma reactor of claim 2, wherein a top surface of the cylindrical dielectric window is flat or curved.

4. The plasma reactor of claim 2, the gas injector is formed at a center of the top surface of cylindrical dielectric window to uniformly inject the reaction gas.

5. The plasma reactor of claim 1, wherein the first and second external coils have a positive integer number as a number of coils, and a positive real number as a number of turns, the coils of each of the first and second external coils being connected in parallel with each other.

6. The plasma reactor of claim 1, wherein the multiple antenna structure comprises the first and second external coils connected in parallel with each other, and an electric current flows along the first and second external coils in the same direction.

7. The plasma reactor of claim 1, wherein the distance between the first and second external coils is equal to or shorter than a radius of the first external coil.

8. The plasma reactor of claim 1, wherein the multiple antenna structure further comprises a first internal antenna coil disposed on an upper portion the cylindrical dielectric window, a radius of the first internal antenna coil being less than that of the first external coil and the multiple antenna structure being connected with the first internal antenna coil in parallel or series.

9. The plasma reactor of claim 8, wherein the multiple antenna structure further comprises a second internal coil disposed on an upper portion of the cylindrical dielectric window and the first internal coil is disposed above the second internal coil at a predetermined distance.

10. The plasma reactor of claim 9, wherein the first and second internal coils have positive integer number as a number of coils, and positive real number as a number of turns, the coils of each of the first and second internal coils are connected in parallel with each other.

11. The plasma reactor of claim 9, wherein the multiple antenna structure comprises the first and second internal coils respectively connected in parallel, and an electric current flows along the first and second internal coils in the same direction.

12. The plasma reactor of claim 9, wherein a distance between the first and second internal coils is equal to or shorter than a radius of the first internal coil.

13. The plasma reactor of claim 8, wherein the internal antenna coil is formed in a cylindrical-shape or a spiral-shape.

14. The plasma reactor of claim 1, wherein the electric power supply unit comprises:
   an RF electric power supply unit connected with the multiple antenna structure; and
   a lower electric power supply unit connected with a lower electrode of the chamber,
   wherein each of the RF and lower electric power supply units comprises a matching circuit and a high frequency electric power source connected with the matching circuit.

* * * * *